US009311855B2

(12) United States Patent
Jung et al.

(10) Patent No.: US 9,311,855 B2
(45) Date of Patent: Apr. 12, 2016

(54) BRIDGE LINES FOR POWERING A SMALL FORM FACTOR OLED DISPLAY DEVICE

(71) Applicant: LG Display Co., Ltd., Seoul (KR)

(72) Inventors: Dae Sung Jung, Paju-si (KR); Yeong Hyeok Yun, Paju-si (KR); Mi So Kim, Seoul (KR); Seong Rim Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/812,628

(22) Filed: Jul. 29, 2015

(65) Prior Publication Data

US 2016/0035284 A1    Feb. 4, 2016

(30) Foreign Application Priority Data

Jul. 31, 2014  (KR) .................... 10-2014-0098514

(51) Int. Cl.
  *G09G 3/30*   (2006.01)
  *H05B 33/06*  (2006.01)
  *H05B 33/12*  (2006.01)
  *G09G 3/32*   (2006.01)

(52) U.S. Cl.
  CPC ...... *G09G 3/3258* (2013.01); *G09G 2300/0408* (2013.01); *G09G 2300/0413* (2013.01); *G09G 2300/0426* (2013.01); *G09G 2300/0809* (2013.01); *G09G 2310/0232* (2013.01); *G09G 2310/0272* (2013.01)

(58) Field of Classification Search
  CPC ....... G09G 3/3258; G09G 3/30; H05B 33/12; H05B 33/06
  See application file for complete search history.

(56) References Cited

U.S. PATENT DOCUMENTS

| 2006/0279499 | A1  | 12/2006 | Park et al.              |
|--------------|-----|---------|--------------------------|
| 2007/0080905 | A1* | 4/2007  | Takahara ........ G09G 3/3233 345/76 |
| 2008/0266210 | A1  | 10/2008 | Nonaka                   |
| 2009/0102758 | A1  | 4/2009  | Anzai et al.             |
| 2009/0102824 | A1  | 4/2009  | Tanaka et al.            |
| 2009/0128017 | A1* | 5/2009  | Sagawa ........ H01L 27/3276 313/504 |

OTHER PUBLICATIONS

European Search Report for European Patent Application No. EP 15179428.6, Dec. 21, 2015, 8 pages.

* cited by examiner

*Primary Examiner* — Joseph L Williams
(74) *Attorney, Agent, or Firm* — Fenwick & West LLP

(57) ABSTRACT

An organic light emitting diode (OLED) display device includes a substrate including a circular arc portion and a driving circuit connecting portion connected to the top of the circular arc portion. The circular arc portion is substantially circular around a center point. A display area is formed in the circular arc portion. The display area has a circular shape centered around the center point. A driving power supply line is formed in the circular arc portion and configured to provide a driving voltage for OLED pixels of the OLED display device. The driving power supply line formed to at least partially surround the display area. A number of power lines electrically connect the driving power supply line to the OLED pixels. A number of bridge lines are formed outside of the display area, where each bridge line connecting one of the power lines with at least one adjacent power line.

17 Claims, 6 Drawing Sheets

BRIDGE LINES FOR POWERING A SMALL FORM FACTOR OLED DISPLAY DEVICE

CROSS REFERENCE TO RELATED APPLICATIONS

This application claims the benefit of the Korean Patent Application No. 10-2014-0098514 filed on Jul. 31, 2014, which is hereby incorporated by reference for all purposes as if fully set forth herein.

BACKGROUND OF THE INVENTION

1. Field of the Invention

The present invention relates to a display device, and more particularly, to a display device having a circular display portion.

2. Discussion of the Related Art

Generally, display devices have been widely used as display screens of various products such as televisions, notebook computers and monitors as well as portable electronic devices such as mobile communication terminals, electronic diaries, electronic books, portable multimedia players (PMPs), navigation systems, ultra mobile PCs (UMPCs), mobile phones, smart phones, tablet PCs (personal computers) and watch phones.

Of the display devices, a liquid crystal display device, an organic light emitting display device and an Electrophoretic display device may be manufactured at slim sizes, whereby studies for developing these display devices as flexible display devices have been made.

A flexible display device based on an organic light emitting diode displays a desired picture image by controlling a current, which flows from a pixel power line to the organic light emitting diode, in accordance with a data signal. Such a flexible display device based on an organic light emitting diode has a rectangular type display portion on a plane due to an arrangement structure of a signal line, an arrangement structure of a pixel driving power line, and an arrangement structure of a driving circuit.

Recently, as importance in appearance and design of the display device has been considered and attention of consumers to wearable devices such as a watch phone has been increased, studies and developments of a display device having a circular display portion not a rectangular display portion have been made.

Meanwhile, in the display device having a circular display portion based on an organic light emitting diode, the organic light emitting diode of each of a plurality of pixels arranged in the circular display portion emits light through a current corresponding to a data signal supplied from pixel power lines.

However, resistance deviation between the pixel power lines occurs due to a difference in lengths of the pixel power lines connected to the respective pixels, and a pixel driving power source applied to each pixel is varied per pixel due to the resistance deviation, whereby a problem occurs in that luminance deviation per area occurs in the circular display portion.

The aforementioned display device having a circular display portion based on an organic light emitting diode is owned for derivation of the present invention by the inventor of this application or is technical information obtained by a process for derivation of the present invention, and is not regarded as the prior art necessarily disclosed to a general public prior to application of the present invention.

SUMMARY OF THE INVENTION

Accordingly, the present invention is directed to a display device that substantially obviates one or more problems due to limitations and disadvantages of the related art.

An organic light emitting diode (OLED) display device includes a substrate including a circular arc portion and a driving circuit connecting portion connected to the top of the circular arc portion. The circular arc portion is substantially circular around a center point. A display area is formed in the circular arc portion. The display area has a circular shape centered around the center point. A driving power supply line is formed in the circular arc portion and configured to provide a driving voltage for OLED pixels of the OLED display device. The driving power supply line formed to at least partially surround the display area. A number of power lines electrically connect the driving power supply line to the OLED pixels. A number of bridge lines are formed outside of the display area, where each bridge line connecting one of the power lines with at least one adjacent power line.

An advantage of the present invention is to provide a display device that may minimize luminance deviation per area of a circular display portion.

Another advantage of the present invention is to provide a display device having a thin bezel width while having a circular display portion.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, a display device according to the preferred embodiment of the present invention will be described in detail with reference to the accompanying drawings. Wherever possible, the same reference numbers will be used throughout the drawings to refer to the same or like parts. Also, in the following description of the present invention, if detailed description of elements or functions known in respect of the present invention is determined to make the subject matter of the present invention unnecessarily obscure, the detailed description will be omitted.

Figure 1:
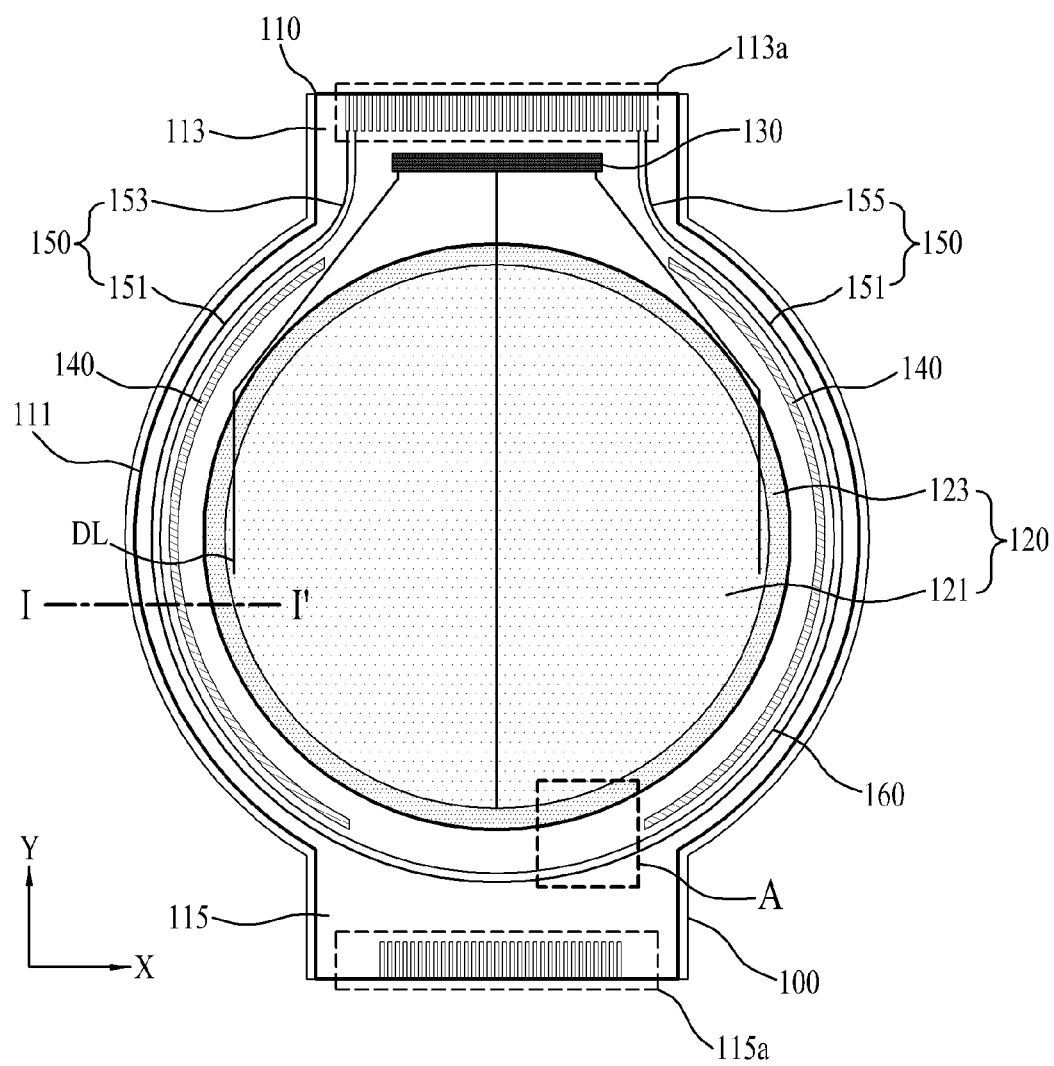
FIG. 1 is a plane view briefly illustrating a display device according to one embodiment of the present invention.
Figure 2:
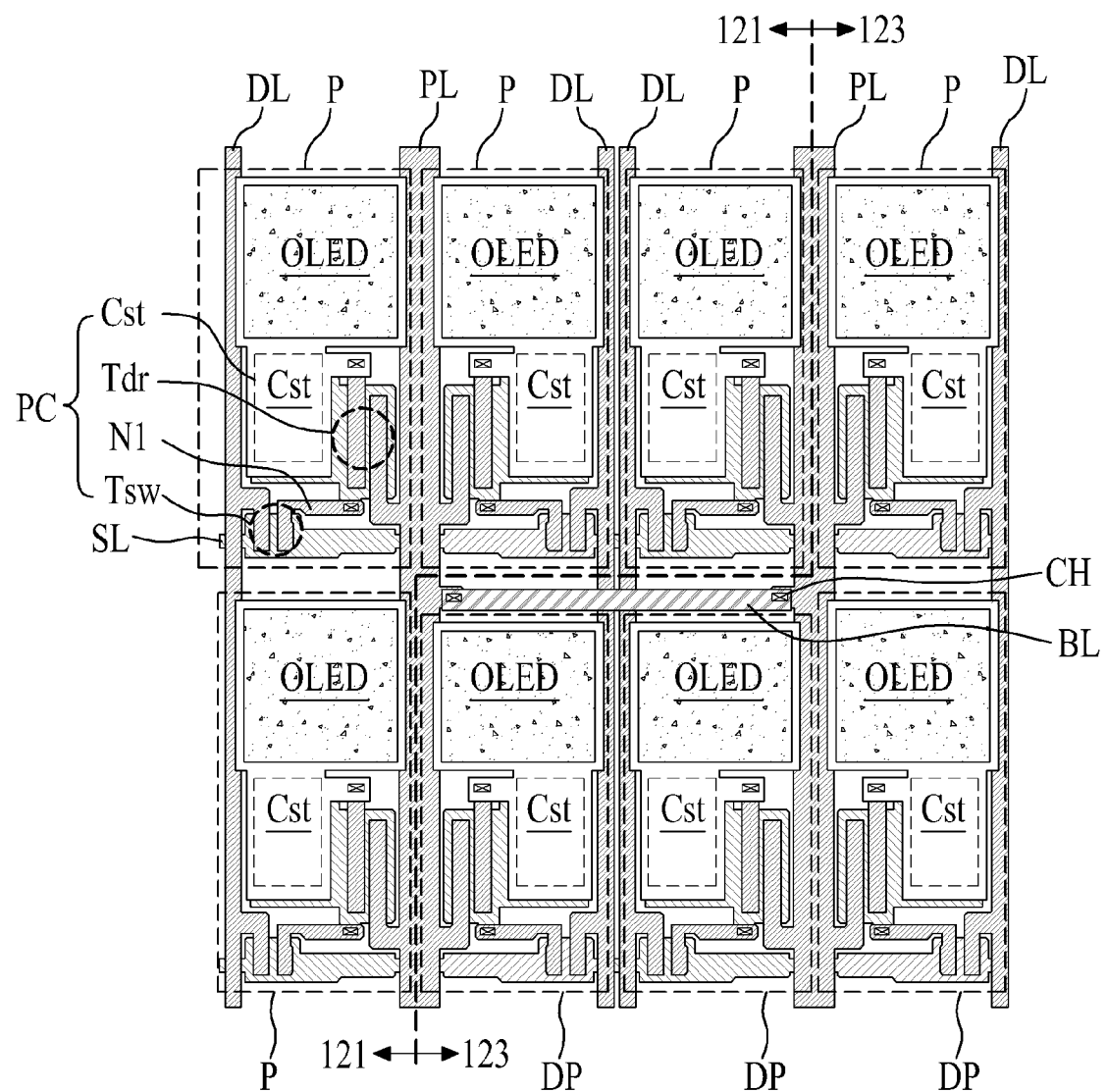
FIG. 2 is a view illustrating pixels and dummy pixels formed in a circular display portion shown in FIG. 1.
Figure 3:
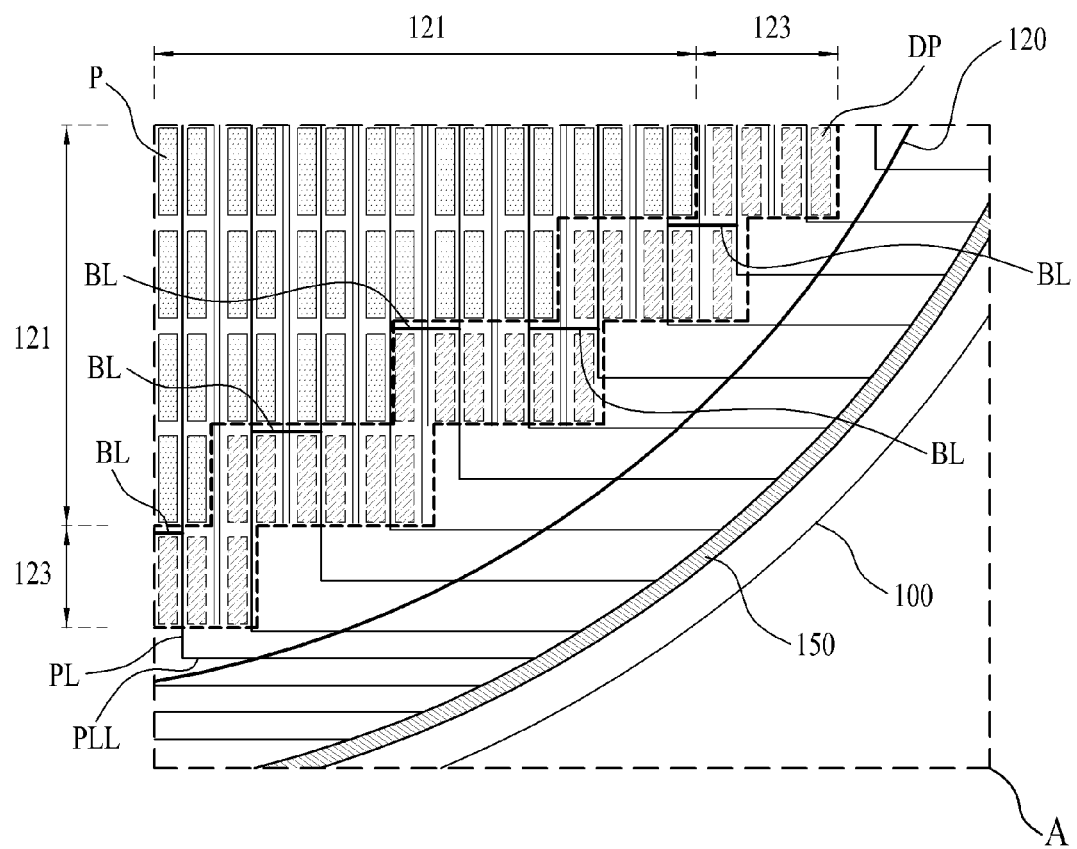
FIG. 3 is an enlarged view of a portion "A" shown in FIG. 1.
Figure 4:
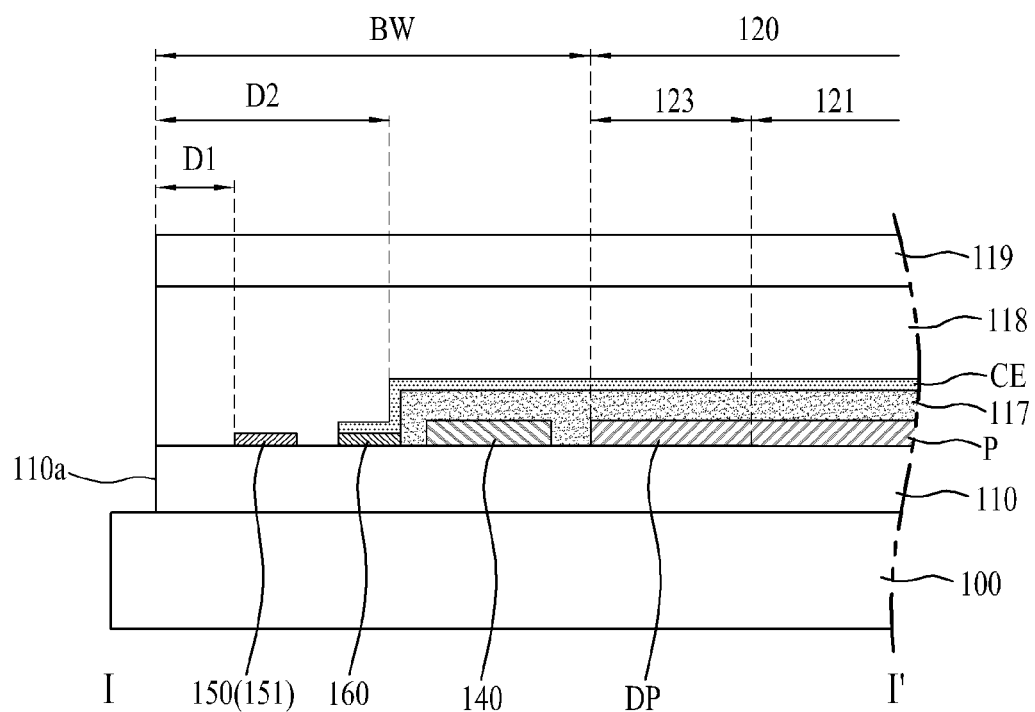
FIG. 4 is a cross-sectional view taken along line I-I' shown in FIG. 1.

FIG. 1 is a plane view briefly illustrating a display device according to one embodiment of the present invention, FIG. 2 is a view illustrating pixels and dummy pixels formed in a circular display portion shown in FIG. 1, FIG. 3 is an enlarged view of a portion "A" shown in FIG. 1, and FIG. 4 is a cross-sectional view taken along line I-I' shown in FIG. 1.

Referring to FIGS. 1 to 4, the display device according to one embodiment of the present invention includes a substrate 110, a circular display portion 120, a driving circuit portion 130, a driving power supply line 150, and a cathode power supply line 160.

The substrate 110 may include a circular arc portion 111 and a driving circuit connecting portion 113, and its example may include a flexible substrate, for example, a plastic substrate.

The circular arc portion 111 is formed in a shape of a circular arc having the same first radius based on a center portion of the circular display portion 120.

The driving circuit connecting portion 113 is projected (or extended) from one side (for example, upper side) of the circular arc portion 111 to have a certain size. The driving circuit connecting portion 113 may include the driving circuit portion 130 connected with the circular display portion 120, various link lines, and a driving pad portion 113a. The driving circuit connecting portion 113 is connected with a display driving portion (not shown) of the display device through the driving pad portion 113a. The driving pad portion 113a may include a plurality of data pads to which image data for displaying images on the circular display portion 120 are supplied from the display driving portion, a plurality of power pads to which a power source required for driving of a pixel is supplied, and a plurality of control signal pads to which a control signal is supplied.

The substrate 110 may further include a touch circuit connecting portion 115. The touch circuit connecting portion 115 is projected (or extended) from the other side of the circular arc portion 111 to have a certain size. The touch circuit connecting portion 115 may include a touch driving line of a touch panel (not shown) arranged on the circular display portion 120, a routing line connected to a touch sensing line, and a touch pad portion 115a. This touch circuit connecting portion 115 is connected with a touch driving portion (not shown) of the display device through the touch pad portion 115a. The touch pad portion 115a may include a plurality of driving line pads connected to the touch driving line, and a plurality of sensing line pads connected to the touch sensing line.

The substrate 110 may be attached onto a support substrate 100. That is, the support substrate 100 is formed in the same shape as that of the substrate 110, and maintains the substrate 110 made of a flexible material in a plane state. In this case, if the substrate 110 is made of a non-flexible material, it is preferable that the support substrate 100 is omitted for slimming of the display device.

The circular display portion 120 is formed on the circular arc portion 111 of the substrate 110 in a shape of a circle. That is, the circular display portion 120 may be formed in a shape of a circle having a second radius smaller than the radius of the circular arc portion 111, based on the center portion. At this time, the circular arc portion 111 and the circular display portion 120 are substantially formed in a shape of a concentric circle, whereby a bezel width BW of the display device, which is defined between an outer sidewall of the substrate 110 and the circular display portion 120, may be reduced.

The circular display portion 120 includes a display area 121 comprised of a plurality of pixels P formed on the substrate 110, and a dummy pixel area 123 surrounding the display area 121, a plurality of pixel power lines, and a plurality of bridge lines BL.

The display area 121 includes a plurality of pixels P arranged in a matrix arrangement to display images. As an example, the matrix of pixels may be arranged in row-column manner. An outer circumference portion of the display area 121 may be formed in a shape of a stair due to the arrangement structure of the pixels P based on a curvature of the circular display portion 120. That is, since rectangular pixels are arranged along a circumference of the display area 121 to form the circular display portion 120, the outer circumference portion of the display area 121 is substantially formed in a shape of a stair not a circle due to the rectangular pixels. However, if the display area 121 has resolution more than a certain level, since the outer circumference portion of the display area 121 is perceived in a shape of a circle, the outer circumference portion of the display area 121 formed in a fine stair shape by pixel arrangement should be understood as a circle shape. In this case, since the circumference of the display area 121 is substantially formed in a shape of a concentric circle with the circular arc portion 111, curvatures of the display area 121 and the circular arc portion 111 are matched with each other, whereby esthetic design of the display device according to the present invention may be improved, and increase of a bezel width, which is caused as the curvatures of the display area 121 and the circular arc portion 111 are not matched with each other, may be avoided.

Each of the plurality of pixels P is formed in a pixel area defined by a plurality of scan lines SL, a plurality of pixel power lines PL and a plurality of data lines DL, which are formed on the circular display portion 120 at certain intervals. In this case, the plurality of pixel power lines PL and the plurality of data lines DL are formed at certain intervals to cross the plurality of scan lines SL.

Each of the plurality of pixels P may include a pixel circuit (PC) and an organic light emitting diode (OLED).

The pixel circuit PC is connected to its adjacent scan line SL, data line DL and pixel power line PL, and controls a current flowing in the organic light emitting diode OLED in accordance with a data signal from the data line DL in response to a scan pulse from the scan line SL. The pixel circuit PC according to one embodiment may include a switching transistor Tsw, a driving transistor Tdr, and a capacitor Cst.

The switching transistor Tsw includes a gate electrode connected to the scan line SL, a first electrode connected to the data line, and a second electrode connected to a gate terminal N1 of the driving transistor Tdr. In this case, the first and second electrodes of the switching transistor Tsw may be source electrode or drain electrode in accordance with a direction of the current. The switching transistor Tsw is switched in accordance with the scan pulse supplied to the scan line SL, and supplies the data signal, which is supplied to the data line DL, to the driving transistor Tdr.

The driving transistor Tdr is turned on in accordance with a voltage of the capacitor Cst to control the amount of the current flowing from the driving power line PL toward the organic light emitting diode OLED. To this end, the driving transistor Tdr includes a gate electrode connected to the second electrode N1 of the switching transistor Tsw, a source electrode connected to the pixel power line PL, and a drain electrode to be connected to the organic light emitting diode OLED. The driving transistor Tdr is switched in accordance with the data signal supplied from the switching transistor Tsw and controls the data current flowing from the pixel power line PL toward the organic light emitting diode OLED.

The capacitor Cst is connected between a gate terminal N1 and a source terminal of the driving transistor Tdr to store a voltage corresponding to the data signal supplied to the gate terminal of the driving transistor Tdr, and turns on the driving transistor Tdr by the stored voltage.

The organic light emitting diode OLED may include an anode electrode (or pixel electrode) connected to the source terminal of the driving transistor Tdr, an organic light emitting layer formed between the anode electrode and a cathode electrode layer CE. The organic light emitting diode OLED displays a predetermined image by emitting light in accordance with the data current flowing from the pixel power line PL to the cathode electrode layer CE in accordance with switching of the driving transistor Tdr.

The cathode electrode layer CE is formed to cover the circular display portion 120 and commonly connected to the organic light emitting layer of the organic light emitting diode OLED formed in each pixel.

The dummy pixel area 123 includes a plurality of dummy pixels DP formed along the circumference of the display area 121 to surround the pixels P formed at the outmost of the display area 121. That is, the dummy pixels DP are formed to adjoin the outmost pixel P of each horizontal line of the display area 121. At this time, the number of the dummy pixels DP may be formed in each horizontal line equally or differently in accordance with the curvature of the display area 121. The plurality of dummy pixels DP serves as an anti-static circuit, which prevents external static electricity from being transferred to the pixels P of the display area 121, without displaying images unlike the pixels P formed in the display area 121.

The plurality of pixel power lines PL are formed at certain intervals in parallel with the data lines DL, and apply the pixel driving power source to the second electrode of the driving transistor Tdr of each pixel P. For example, each of the pixel power lines PL may be shared by two adjacent pixels P. In this case, a pair of pixels adjacent to each other along a longitudinal direction of the scan line SL. Therefore, according to the present invention, the number of pixel power lines PL and the number of power link lines, which will be described later, may be reduced. As a result, the interval between the pixels P may be reduced as much as an area reserved by the reduced pixel power lines PL and thus the width of the driving circuit connecting portion 113 may be reduced, and the formation area of the power link lines may be reduced, whereby the bezel width of the display device may be reduced.

Each of the plurality of bridge lines BL is formed in the dummy pixel area 123, so as to be connected to its adjacent pixel power line PL. That is, the plurality of pixel power lines PL include a plurality of power line groups having two adjacent pixel power lines PL, and each of the plurality of bridge lines BL is formed in the plurality of power line groups along the outer circumference portion of the display area 121 one to one, thereby electrically connecting two pixel power lines PL included in each power line group with each other. Each of the plurality of bridge lines BL is formed on a layer different from the pixel power lines PL without being electrically connected with the data lines DL while crossing a pair of pixel power lines PL desired by each bridge line to connect them with each other, thereby connecting the pair of pixel power lines PL with each other through a contact hole CH. For example, each of the plurality of bridge lines BL may be patterned on the same layer as the scan line SL or the anode electrode.

In one embodiment, the OLEDs of the dummy pixels adjacent to the display area are reduced in size in comparison to display area pixels and/or other dummy pixels in order to accommodate the bridge lines BL. This reduction in size may include a reduction in height along the axis running parallel to the columns of pixels, so that bridge lines are able to fit in this space and connect power lines laterally. As a result, the bridge lines do not require any additional space on the surface of the substrate between the display area and dummy pixel area.

Each of the plurality of bridge lines BL is formed in the dummy pixel area 123 adjacent to the display area 121 such that a pair of pixel power lines PL have equipotential electrically, whereby picture quality deterioration caused by length deviation of the pixel power lines PL is resolved. That is, each of the plurality of bridge lines BL is formed in the dummy pixel area 123, which is adjacent to the display area 121 or spaced apart from the display area 121 as much as at least one dummy pixel, so as not to generate potential deviation at a pixel power incoming portion which is one side of the pixel power lines PL to which the pixel driving power source is supplied. For reference, each of the plurality of bridge lines BL may be formed in the display area 121 spaced apart from the pixel power incoming portion. In this case, potential deviation is generated at one side of each of the pixel power lines PL between the power incoming portion and the bridge line BL, whereby the pixel power lines PL cannot have equipotential electrically.

The driving circuit portion 130 according to the first embodiment displays a predetermined image on the display area 121 of the circular display portion 120 by driving the plurality of pixels formed in the display area 121 of the circular display portion 120 by using image data, a control signal, and a driving voltage, which are supplied from the display driving portion through the driving pad portion 113a. The driving circuit portion 130 according to the first embodiment is comprised of an integrated circuit, is packaged in a chip package area provided in the driving circuit connecting portion 113, and is connected to the plurality of scan lines SL and the plurality of data lines DL through link lines formed between the chip package area and the circular display portion 120, whereby the data signal is supplied to the plurality of data lines DL to synchronize with supply of the scan pulse to the plurality of scan lines SL. That is, the driving circuit portion 130 according to the first embodiment converts image data to analog type data signal in response to the control signal and generates the scan pulse, and supplies the data signal to the plurality of data lines DL to synchronize with sequential supply of the generated scan pulse to the plurality of scan lines SL. At this time, the driving circuit portion 130 generates pixel data per pixel by aligning the input image data to be suitable for the pixel arrangement structure of the circular display portion 120, and converts the generated pixel data to the data signal.

The driving circuit portion 130 according to the second embodiment supplies the data signal to the plurality of data lines DL formed in the circular display portion 120 by using image data, a control signal, and a driving voltage, which are supplied from the display driving portion through the driving pad portion 113a. The driving circuit portion 130 according to the second embodiment is comprised of an integrated circuit, is packaged in the chip package area provided in the driving circuit connecting portion 113, and is connected to the plurality of data lines through data link lines formed between the chip package area and the circular display portion 120, whereby the data signal is supplied to the plurality of data lines DL. That is, the driving circuit portion 130 according to the second embodiment generates pixel data per pixel by aligning image data input in response to the control signal to be suitable for the pixel arrangement structure of the circular display portion 120, converts the generated pixel data to the data signal, and supplies the converted data signal to the plurality of data lines DL.

If the display device according to the present invention includes the driving circuit portion 130 according to the second embodiment, the display device according to the present invention further includes a scan driving circuit 140 formed on the circular arc portion 111 of the substrate 110 along the circumference of the circular display portion 120 instead of omitting a plurality of scan link lines formed in the driving circuit connecting portion 113 to connect a scan channel of the driving circuit portion 130 with the plurality of scan lines SL one to one.

The scan driving circuit 140 is formed in a shape of a circular arc along the circumference of the circular display portion 120 and then connected to the plurality of scan lines SL. The scan driving circuit 140 generates scan pulses in response to a scan control signal supplied from the display driving portion through scan control link lines and the driving pad portion 130a and sequentially supplies the generated scan pulses to the plurality of scan lines SL. As one example, the scan driving circuit 140 may be formed along a left circumference or right circumference of the circular display portion 120 and may supply the scan pulses to one end or the other end of each of the plurality of scan lines SL. As another example, the scan driving circuit 140 may be formed along the left circumference or right circumference of the circular display portion 120 and may simultaneously supply the scan pulses to one end and the other end of each of the plurality of scan lines SL. As other example, the scan driving circuit 140 may be formed along the left circumference or right circumference of the circular display portion 120, and may supply the scan pulses to one end of the odd numbered scan lines SL and supply the scan pulses to the other end of the odd numbered scan lines SL.

If the display device according to the present invention includes the scan driving circuit 140, the present invention may reduce the bezel width BW of the display device by reducing a size of the driving circuit connecting portion 113 in accordance with omission of the plurality of scan link lines or reducing a length of the driving circuit connecting portion 113, and the circular arc portion 111 may be formed in a shape of a concentric circle with the circular display portion 120. Alternatively, the present invention may arrange or form the plurality of data link lines in the driving circuit connecting portion 113 more sufficiently by obtaining a space for forming the data link lines as much as a space reserved by the plurality of scan link lines which are omitted, instead of reducing the bezel width BW of the display device.

The driving power supply line 150 serves as a main power line supplied to the plurality of pixel power lines PL formed in the circular display portion 120 and is formed on the substrate 110 along the circumference of the circular display portion 120 to have a constant width and thickness, and its both ends are connected to a driving power pad of the driving pad portion 113a formed in the driving circuit connecting portion 113.

The driving power supply line 150 according to one embodiment may be categorized into a circumference line 151, a first shoulder line 153 and a second shoulder line 155 in accordance with its position formed on the substrate 110.

The circumference line 151 is formed along the circumference of the other circular display portion 120 except one side of the circular display portion 120 adjacent to the driving circuit connecting portion 113. Preferably, the circumference line 151 is formed in a shape of a concentric circle with at least one of the circular display portion 120 and an outer sidewall of the substrate 110. That is, since the driving power supply line 150 is formed at the outmost of the substrate 110, the driving power supply line 150 should be spaced apart from the outer sidewall 110a of the substrate 110 as much as a predetermined distance D1 by considering inflow of static electricity, etc. If the circumference line 151 is not formed in a shape of a concentric circle with the circular display portion 120, the distance D1 between the outer sidewall 110a of the substrate 110 and the circumference line 151 becomes non-uniform, whereby static electricity may be entered from the circumference line 151 arranged to be relatively close to the outer sidewall 110a of the substrate 110. Therefore, it is preferable that the circumference line 151 is formed in a shape of a concentric circle with the circular display portion 120, and is also formed in a shape of a concentric circle with the outer sidewall 110a of the substrate 110.

The first shoulder line 153 is formed between one side end of the circumference line 151 adjacent to the driving circuit connecting portion 113 and a first driving power pad of the driving pad portion 113a at a certain curvature and connects one side end of the circumference line 151 to the first driving power pad.

The second shoulder line 155 is formed between the other side end of the circumference line 151 adjacent to the driving circuit connecting portion 113 and a second driving power pad of the driving pad portion 113a at a certain curvature and connects the other side end of the circumference line 151 to the second driving power pad.

The driving power supply line 150 constructed as above is connected to a lower end of each of the plurality of pixel power lines PL based on the center portion of the display area 121 through each of the plurality of driving power link lines PLL.

Each of the plurality of driving power link lines PLL is extended or projected from the driving power supply line 150 along a direction (for example, longitudinal direction of the scan line SL) crossing the pixel power line PL to have a certain width and thus is connected to the lower end of the corresponding pixel power line PL. Also, each of the plurality of driving power link lines PLL is formed between the center portion of the circular display portion 120 and the lower side of the circular display portion 120 so as not to cross the data line DL. In this case, according to the present invention, picture quality deterioration caused by signal interference between the data signal and the pixel driving power source may be prevented from being generated.

Each of the plurality of driving power link lines PLL may be extended from the driving power supply line 150 along a longitudinal direction of the pixel power line PL and thus may be connected to the lower end of the corresponding pixel power line PL. However, since a horizontal width of the pixel P is narrower than its vertical width, a side area of the pixel P becomes relatively wider than the lower area of the pixel P. Therefore, in order to minimize signal interference caused by the narrow interval between the driving power link lines PLL, it is preferable that the plurality of driving power link lines PLL are extended from the driving power supply line 150 to correspond to the direction crossing the pixel power line PL and thus connected to the lower end of the pixel power line PL. However, the pixel power lines PL formed at the lower end of the display area 121 adjacent to the touch pad portion 115a, that is, at the center of the display area 121, may be formed along the longitudinal direction of the pixel power line PL.

The aforementioned driving power supply line 150 is connected to the lower end of each of the plurality of pixel power lines PL, whereby the pixel driving power source is supplied to each pixel power line PL in a direction opposite to a supply direction of the data signal supplied from the data driving portion 130 to the data line DL. As a result, the present invention may resolve picture quality deterioration or luminance non-uniformity, which is caused by deviation of the data signal based on resistance of the data line DL per position of each pixel P and deviation of the pixel driving power source based on resistance of the pixel power line PL. For example, in a middle pixel (hereinafter, referred to as "first middle pixel") of the first horizontal line and a middle pixel (hereinafter, referred to as "second middle pixel") of the last horizontal line, if the supply direction of the data signal and the supply direction of the pixel driving power source are the same as each other, voltage drop of each of the data signal and the pixel driving power source occurs more frequently in the second middle pixel than the first middle pixel, whereby luminance deviation between the first and second middle pixels occurs even in case of the same data signal. In contrast, if the supply direction of the data signal and the supply direction of the pixel driving power source are opposite to each other, voltage drop of the data signal occurs more frequently in the second middle pixel than the first middle pixel, and voltage drop of the pixel driving power source occurs more frequently in the first middle pixel than the second middle pixel, whereby deviation of the data signal and deviation of the pixel driving power source may mutually be compensated and as a result luminance deviation between the first and second middle pixels may be minimized for the same data signal.

The cathode power supply line 160 is formed on the substrate 110 between the driving power supply line 150 and the circular display portion 120 along the circumference of the circular display portion 120 to have a constant width and thickness, and its both ends are connected to a cathode power pad of the driving pad portion 113a formed in the driving circuit connecting portion 113. The cathode power supply line 160 according to one embodiment may be formed in parallel with the driving power supply line 150 while having the same structure as that of the driving power supply line 150. The cathode power supply line 160 is electrically connected with the cathode electrode (CE) layer formed on the circular arc portion 111 to cover the circular display portion 120. The cathode power supply line 160 supplies a cathode power, which is supplied from the display driving portion through the cathode power pad, to the cathode electrode (CE) layer, whereby the cathode power is supplied to the organic light emitting diode OLED of every pixel P formed in the circular display portion 120 through the cathode electrode layer.

As described above, the cathode power supply line 160 is formed between the driving power supply line 150 and the circular display portion 120, whereby the bezel width BW of the display device according to the present invention may be reduced. In more detail, since the transistor of each pixel P is covered by a passivation layer 117 made of an organic material for enabling active water permeation, the passivation layer 117 should be spaced apart from the outer sidewall 110a of the substrate 110 as much as a certain distance D2 to prevent the organic light emitting diode OLED from being damaged by water permeated into the passivation layer 117. Therefore, in the present invention, the cathode power supply line 160 connected to the cathode electrode layer CE surrounding the passivation layer 117 is formed between the driving power supply line 150 and the circular display portion 120 such that the passivation layer 117 may be spaced apart from the outer sidewall 110a of the substrate 110 as much as the certain distance D2, whereby the bezel width BW of the display device, which is defined by a width between the outer sidewall 110a of the substrate 110 and the circular display portion 120, may be reduced.

Meanwhile, the cathode power supply line 160 may be formed to be more adjacent to the outer sidewall 110a of the substrate 110 than the driving power supply line 150. However, in this case, the corner portion of the substrate 110 should be extended toward the outskirts to space the passivation layer 117 apart from the outer sidewall 110a of the substrate 110 as much as the certain distance D2, whereby a problem occurs in that the bezel width BW of the display device is increased. Therefore, it is preferable that the cathode power supply line 160 is formed between the driving power supply line 150 and the circular display portion 120.

Additionally, the display device according to one embodiment of the present invention may further include an encapsulation layer 118 formed on the substrate 110 to cover the cathode electrode layer CE, and a barrier substrate 119 formed on the encapsulation layer 118.

The encapsulation layer 118 may be formed in a multi-layered structure that an organic material layer or an inorganic material layer, the organic material layer and the inorganic material layer are deposited alternately.

The barrier substrate 119 may be made of a material having low water permeability, for example, polymer material, and may be attached onto the encapsulation layer 118 by a transparent adhesive. A touch panel is attached onto the barrier substrate 119, and a polarizing film may additionally be attached onto the touch panel.

As described above, according to the present invention, as the adjacent pixel power lines PL are connected to each other through the plurality of bridge lines BL, luminance deviation per area of the circular display portion may be minimized due to equipotential of the pixel power lines PL, whereby picture quality deterioration caused by length deviation of the pixel power lines PL may be resolved. Also, according to the present invention, the circular arc portion 111 of the substrate 110 and the circular display portion 120 are formed in a shape of a concentric circle, whereby the display device may have a thin bezel width BW while having the circular display portion 120. Furthermore, according to the present invention, the driving power supply line 150 is formed along the circumference of the circular display portion 120 and also the cathode power line 160 is formed between the driving power supply line 150 and the circular display portion 120, whereby picture quality deterioration caused by voltage drop deviation per position of the driving power supply line 150 may be resolved, reliability deterioration of the pixel P, which is caused by water permeation, may be avoided, and a thinner bezel width BW may be obtained together with the circular display portion 120.

Figure 5:
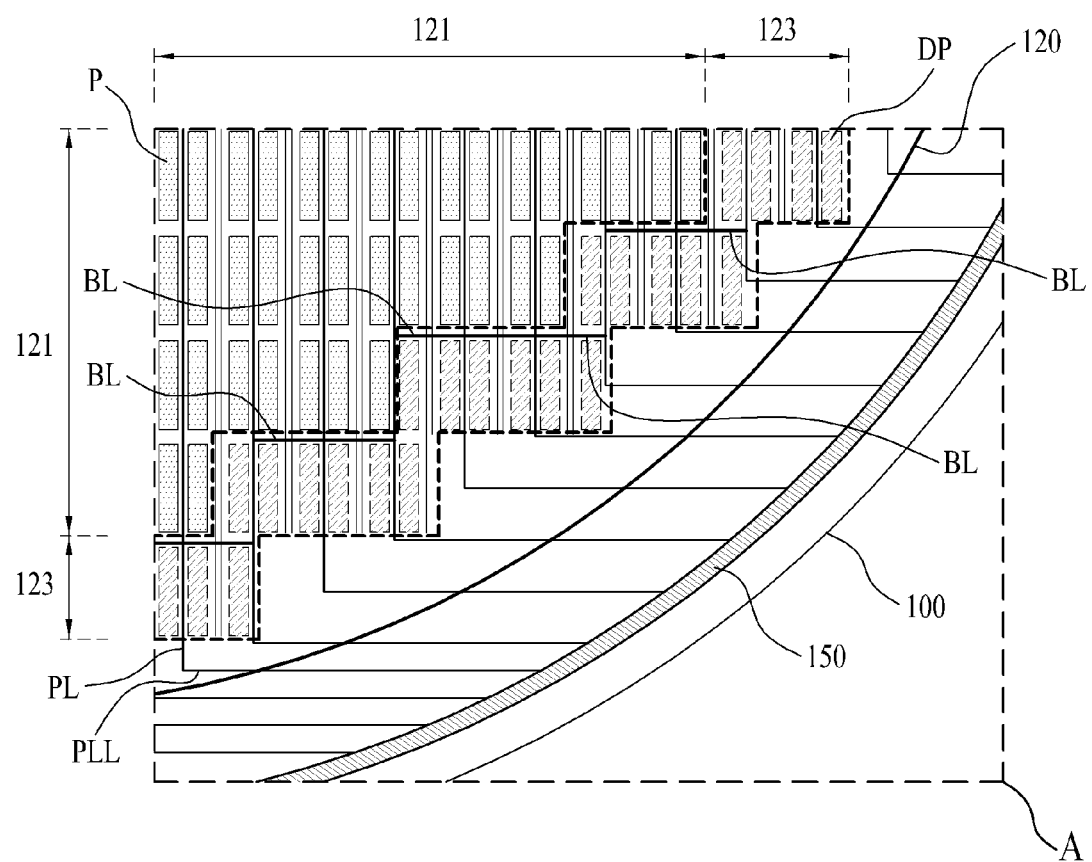
FIG. 5 is another enlarged view of a portion "A" shown in FIG. 1.

FIG. 5 is an enlarged view of a portion "A" shown in FIG. 1, and illustrates a modified example of the bridge lines in the display device according to the present invention.

As shown in FIG. 5, each of the plurality of bridge lines BL according to the modified example is formed in the dummy pixel area 123, so as to connect the adjacent pixel power lines PL to each other, whereby all the plurality of pixel power lines PL have equipotential electrically. In more detail, the outer circumference portion of the display area 121 is formed in a shape of a stair in accordance with the curvature of the circular display portion 120, and two or more pixel power lines PL are formed in parallel at the outer circumference portion of the display area 121 having the stair shape. As a result, the plurality of pixel power lines PL may be categorized into a plurality of power line groups having two or more adjacent pixel power lines PL in accordance with the stair shape of the display area 121.

Each of the plurality of bridge lines BL according to the modified example is formed in the plurality of power line groups one to one, thereby electrically connecting all the pixel power lines PL included in each power line group with each other and electrically connecting the respective pixel power lines PL of the adjacent power line groups with each other. Therefore, each of the plurality of bridge lines BL according to the modified example is formed in each dummy pixel area 123 adjacent to the display area 121 along the circumference of the display area 121 to allow all the pixel power lines PL to have equipotential electrically.

As described above, each of the plurality of bridge lines BL allows all the pixel power lines PL to have equipotential electrically, whereby picture quality deterioration caused by length deviation of the pixel power lines PL may be resolved.

Figure 6:
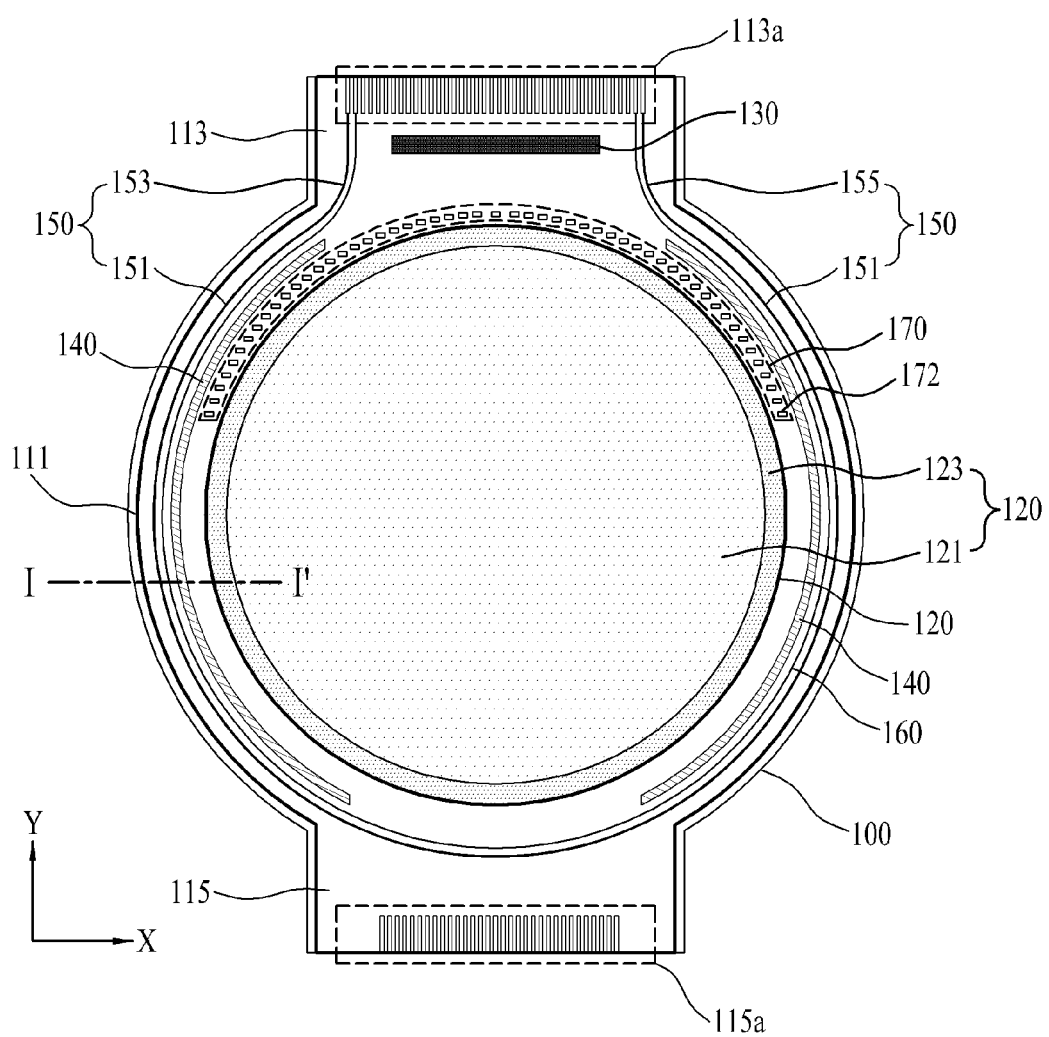
FIG. 6 is a view illustrating a modified example a display device according to the present invention.

FIG. 6 is a view illustrating a modified example of a display device according to the present invention, which is shown in FIGS. 1 to 5. In FIG. 6, a selective portion is additionally provided. Therefore, in FIG. 6, a repeated description of elements corresponding to the same reference numerals as those of FIG. 1 will be omitted, and the selective portion and its related elements will only be described hereinafter.

As shown in FIG. 6, the selective portion 170 includes a plurality of selective circuits 172 formed along the circumference of the circular display portion 120 and connected to two or more data lines DL.

Each of the plurality of selective circuits 172 is connected to a plurality of data groups, each of which includes i (i is a natural number more than 2) number of data lines one to one, thereby driving the i number of data lines, which are included in each data group, based on time division. Each of the plurality of selective circuits 172 according to one example may be a multiplexing circuit, for example, multiplexer, which has one input terminal and i number of output terminals. A data signal is supplied from the driving circuit portion 130 to each input terminal of the plurality of selective circuits 172. The output terminals of each of the plurality of selective circuits 172 are connected to the i number of data lines, which are included in the corresponding data group, one to one. Each of the plurality of selective circuits 172 supplies the data signal, which is supplied to the input terminal, to the i number of data lines included in the corresponding data group, in due order in response to a time-division selective signal.

For example, if one unit pixel includes red, green and blue pixels, each data group may include 3j (j is a natural number) number of data lines to facilitate driving of the unit pixel. In this case, each of the plurality of selective circuits 172 may have 3j number of output channels. It is preferable that the number of data lines included in each data group and the number of output terminals of the selective circuit 172 correspond to the number of pixels constituting one unit pixel or an integer multiple of the number of pixels constituting one unit pixel, without being limited to the 3j number of output terminals.

According to the display device of the present invention, which includes the selective portion 17 as above, as the number of data link lines for connecting the data line DL with the driving circuit portion 130 and its formation area are reduced due to the selective portion 170, the size of the driving circuit connecting portion 113 may be reduced or the driving power supply line 150 and the power supply line 160 may be formed in a shape of a concentric circle. As a result, the bezel width BW of the display device according to the present invention may be more reduced.

Meanwhile, as described above, in the display device according to one embodiment of the present invention, each pixel may be modified to that disclosed in the Korean Laid-Open Patent Nos. 10-2009-0046983, 10-2010-0047505, 10-2011-0057534, 10-2012-0045252, 10-2012-0076215, 10-2013-0066449, 10-2013-0066450, 10-2013-0074147, and the Korean Registered Patent No. 10-0846970 or 10-1073226. In this case, each pixel is connected to the driving power supply line and a reference line. At this time, the driving power supply line is formed in the same structure as that of the aforementioned driving power supply line. The reference line is formed between the cathode power supply line 160 and the circular display portion 120 to have the same structure as that of the aforementioned driving power supply line, whereby the reference line may supply a reference voltage, which is supplied from the display driving portion, to each pixel.

On the other hand, in the display device according to one embodiment of the present invention, each pixel may be modified to that disclosed in the Korean Registered Patent No. 10-0846591 and the Korean Laid-Open Patent Nos. 10-2012-0042084, 10-2012-0069481, and 10-2012-0075828. In this case, each pixel is connected to the driving power supply line and a compensation power line. At this time, the driving power supply line is formed in the same structure as that of the aforementioned driving power supply line. The compensation power line is formed between the cathode power supply line 160 and the circular display portion 120 to have the same structure as that of the aforementioned driving power supply line, whereby the compensation power line may supply a compensation voltage, which is supplied from the display driving portion, to each pixel.

As a result, the structure of the driving power supply line and the equipotential structure of the pixel driving power sources based on the bridge lines according to the present invention may equally be applied to all the pixel structures of the organic light emitting display device.

As described above, the display device according to the present invention has the following advantages.

First, as luminance deviation per area of the circular display portion is minimized, picture quality deterioration caused by length deviation of the pixel power lines may be resolved. In addition, the display device according to the present invention may have a thin bezel width while having the circular display portion.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode (OLED) display device comprising:
   a substrate comprising a circular arc portion and a driving circuit connecting portion connected to the top of the circular arc portion, wherein the circular arc portion is substantially circular around a center point;
   a display area formed in the circular arc portion, the display area comprising a circular shape centered around the center point;
   a driving power supply line formed in the circular arc portion and configured to provide a driving voltage for OLED pixels of the OLED display device, the driving power supply line formed to at least partially surround the display area;
   a plurality of power lines electrically connecting the driving power supply line to the OLED pixels; and
   a plurality of bridge lines formed outside of the display area, each bridge line connecting one of the power lines with at least one adjacent power line.

2. The OLED display device of claim 1, further comprising:
   a plurality of dummy pixels formed in a dummy pixel area surrounding the display area, each bridge line connecting power lines in between at least one of the dummy pixels and at least one of the OLED pixels.

3. The OLED display device of claim 1, wherein each power line is connected to two adjacent columns of pixels, and each pixel is connected to one of the power lines.

4. The OLED display device of claim 1, further comprising:
   a plurality of data lines, a first of the data lines shared by the first column of pixels, a second of the data lines shared by the second column of pixels;
   wherein the first data line is located on an opposite side of the first column of pixels from the shared power line; and
   wherein the second data line is located on an opposite side of the second column of pixels from the shared power line.

5. The OLED display device of claim 1,
   wherein the power lines are formed to extend away from the driving power supply line along a direction parallel to a plurality of scan lines.

6. The OLED display device of claim 5,
   wherein each power line is formed on the substrate to comprise a 90 degree angle, directing a remainder of the power line along an axis parallel and between two columns of pixels.

7. The OLED display device of claim 1,
   wherein the power lines do not intersect or cross any of a plurality of data lines.

8. The OLED display device of claim 1, wherein each of the power lines is connected to one of the bridge lines.

9. The OLED display device of claim 1, wherein at least one bridge line is connected to more than two of the power lines.

10. The OLED display device of claim 1, wherein the bridge lines are oriented along an axis running parallel to perpendicular to columns of the pixels.

11. The OLED display device of claim 1,
    wherein the driving power supply line includes a lower area formed on a side of the circular arc portion opposite from the driving circuit connecting portion; and
    wherein the power lines extend from the lower area of the driving power supply line.

12. The OLED display device of claim 11, wherein the lower area is within a lower half circle of the circular arc portion.

13. The OLED display device of claim 1, wherein each pixel comprises:
    an OLED comprising an anode and a cathode;
    a driving transistor comprising a gate, a source, and a drain, wherein
       the drain is connected to one of the power lines to receive the driving voltage, and
       the source is connected to the anode of the OLED.

14. The OLED display device of claim 1, comprising a cathode power supply line formed in the circular arc portion between the driving power supply line and the display area, a cathode of each pixel being electrically connected to the cathode power supply line.

15. The OLED display device of claim 14, wherein the cathode power supply line comprises a circular shape centered around the center point.

16. The OLED display device of claim 1, wherein each end of the driving power supply line is connected to an associated driving power pad formed in the driving circuit connecting portion.

17. The OLED display device of claim 16, wherein the circular portion of the driving power supply line is connected at each end to a corresponding shoulder portion of the driving power supply line that extends into the driving circuit connecting portion.

* * * * *